Figure 2:
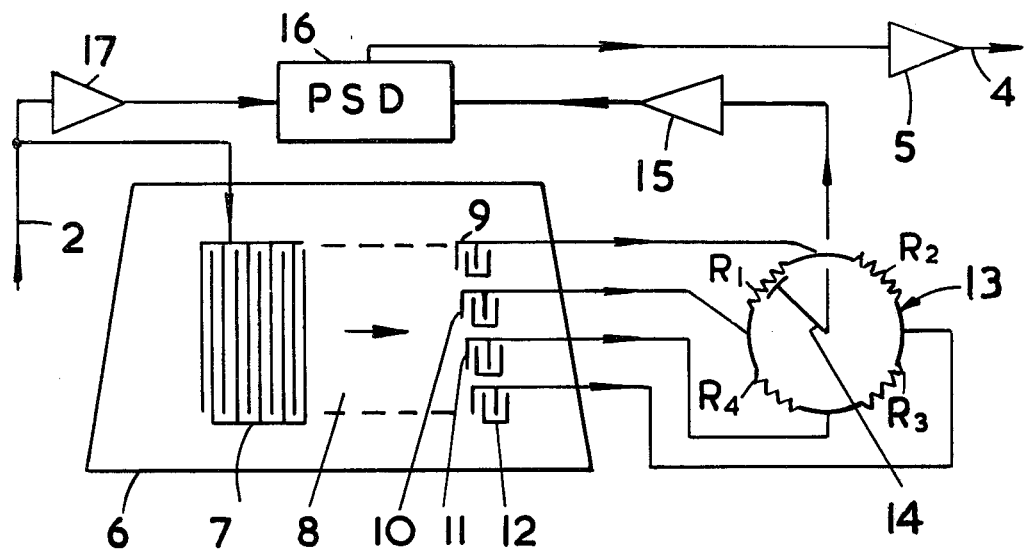

United States Patent [19]

Lewis

[11] 4,115,744
[45] Sep. 19, 1978

[54] PROGRAMABLE FREQUENCY ACOUSTIC WAVE DISCRIMINATOR

[75] Inventor: Meirion Francis Lewis, Malvern, England

[73] Assignee: National Research Development Corporation, London, England

[21] Appl. No.: 835,030

[22] Filed: Sep. 20, 1977

Related U.S. Application Data

[63] Continuation of Ser. No. 717,392, Aug. 24, 1976, abandoned.

[30] Foreign Application Priority Data

Aug. 26, 1975 [GB] United Kingdom ............... 35257/75

[51] Int. Cl.² .............................................. H03B 3/04
[52] U.S. Cl. .................................. 331/16; 331/107 A; 331/179
[58] Field of Search ...................... 331/107 A, 57, 101, 331/17, 27, 25, 28, 15, 16, 179

[56] References Cited

U.S. PATENT DOCUMENTS

| 2,791,694 | 4/1957 | Groenendyke | 331/57 |
| 3,582,540 | 6/1971 | Adler | 331/107 A |
| 3,649,928 | 3/1972 | Rieder et al. | 331/17 |
| 3,852,681 | 12/1974 | Underhill | 331/10 |
| 3,936,765 | 2/1976 | Maines | 331/107 A |
| 3,962,652 | 6/1976 | Zarin et al. | 331/107 A |

OTHER PUBLICATIONS

Microwaves, Jul. 1969, "Digital Tuning Imposes Will on Cavity Oscillators".

*Primary Examiner*—John Kominski
*Attorney, Agent, or Firm*—Cushman, Darby & Cushman

[57] ABSTRACT

An acoustic wave discriminator comprises an acoustic wave delay line having an input transducer and a plurality of output transducer separately connectable to a phase sensitive detector. This detector measures the phase difference between input and output transducers and provides an output for controlling the frequency of a voltage controlled oscillator. A plurality of different frequencies of the oscillator is obtained by connecting different output transducers of the discriminator to the phase sensitive detector.

9 Claims, 5 Drawing Figures

CONTROL SIGNAL – VOLTS

PROGRAMABLE FREQUENCY ACOUSTIC WAVE DISCRIMINATOR

This is a continuation, of application Ser. No. 717,392 filed Aug. 24, 1976, now abandoned.

This invention relates to programmable acoustic wave discriminators for use in controlling the frequency of voltage controlled oscillators (VCO).

As its name suggests a VCO has an output signal whose frequency is controlled by an applied voltage level. Thus a series of frequencies can be separately obtained by applying the required voltages. In practice the VCO's frequency is liable to drift through changes in temperature or voltage, and it is desirable to lock it to a more stable element, such as a SAW delay line. One such system uses a SAW delay line discriminator having two transducers. The phase difference between the transducers is a measure of frequency applied to the discriminator and is used to keep the VCO operating at its desired frequency. One disadvantage of this arrangement is that it only operates at a well-defined comb of frequencies and it is difficult to switch from one to another frequency in a controllable manner.

It is therefore an object of this invention to provide a discriminator suitable for use with a VCO whereby the VCO output can be controlled to oscillate at a plurality of preset frequencies, and to provide a simple and reliable means of switching from one frequency to another.

According to this invention a discriminator for controlling the output frequency of a voltage controlled oscillator, comprises an acoustic wave delay line and a phase sensitive detector arranged to measure the phase difference between signals applied to the delay line and signals received from the delay line and produce a signal representing such phase difference, wherein the delay line comprises a substrate capable of supporting acoustic waves, an input transducer for launching acoustic waves along a track in the substrate and a plurality of output transducers spaced apart along the track for receiving acoustic waves from the input transducer, and switch circuitry for switching each output transducer in turn to the phase sensitive detector.

The roles of input and output transducers may be reversed, i.e. the delay line may use a plurality of input transducers and a single output transducer.

The substrate may be piezoelectric, e.g. quartz or lithium niobate, or non piezoelectric, e.g. glass with pads of piezoelectric material.

The transducer may be an interdigital comb type transducer having constant finger length and spacing. Alternatively they may be frequency and/or amplitude weighted in known ways, e.g. they may be dispersive with varying finger separation, or have variable length fingers. Dispersive transducers are arranged so that path lengths of high and low frequencies remain about the same.

In use with a VCO the output of the phase sensitive detector (PSD) forms the control signal for the VCO whose output is supplied to the input to the delay line.

Figure 1:
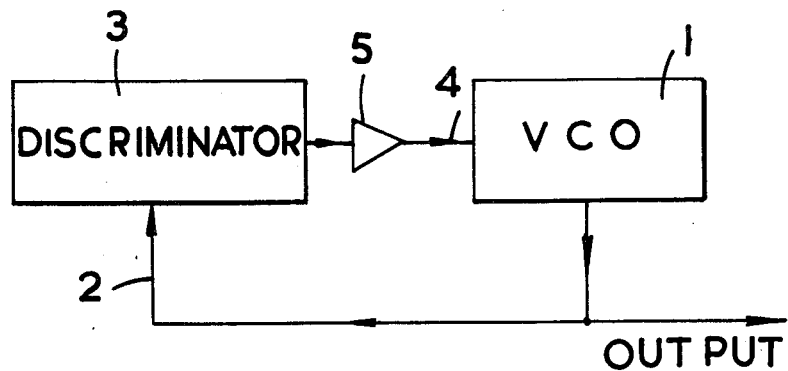
Figure 5:
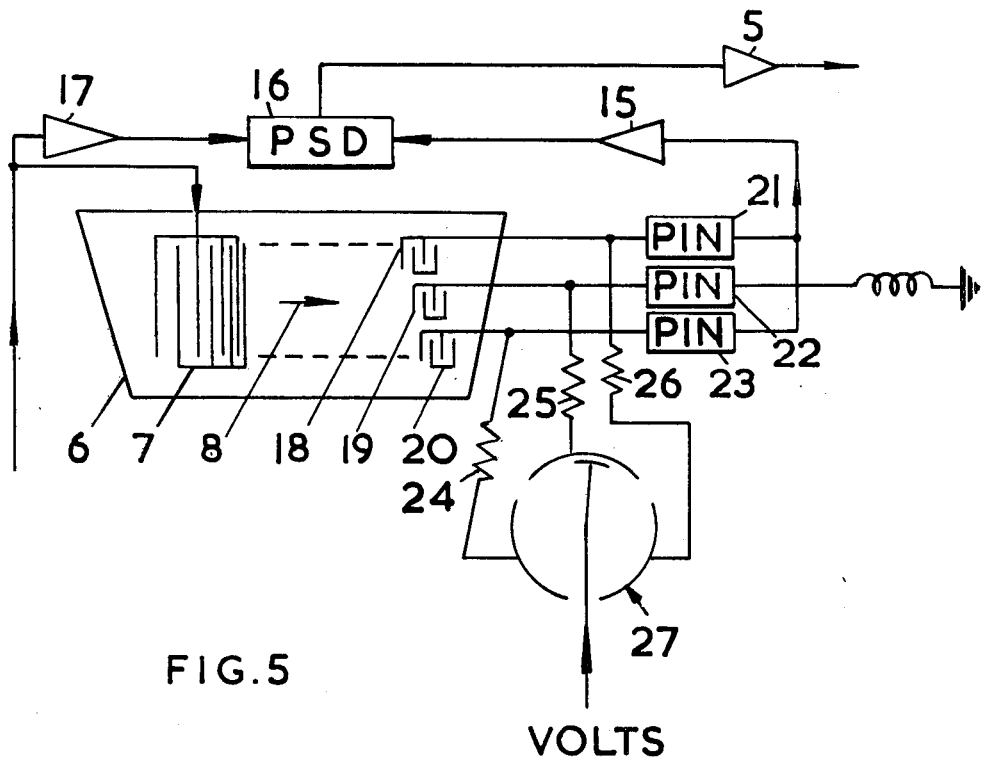
Figure 3:
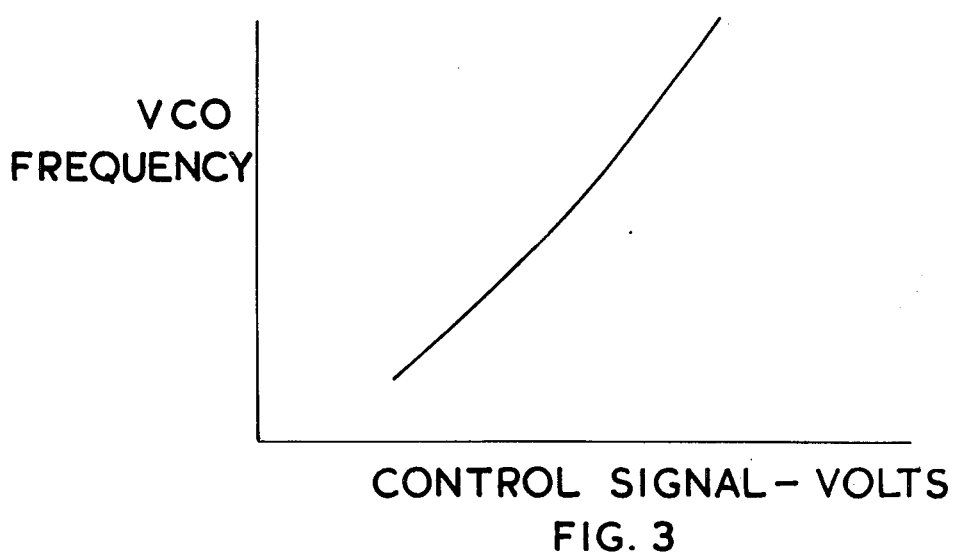
Figure 4:
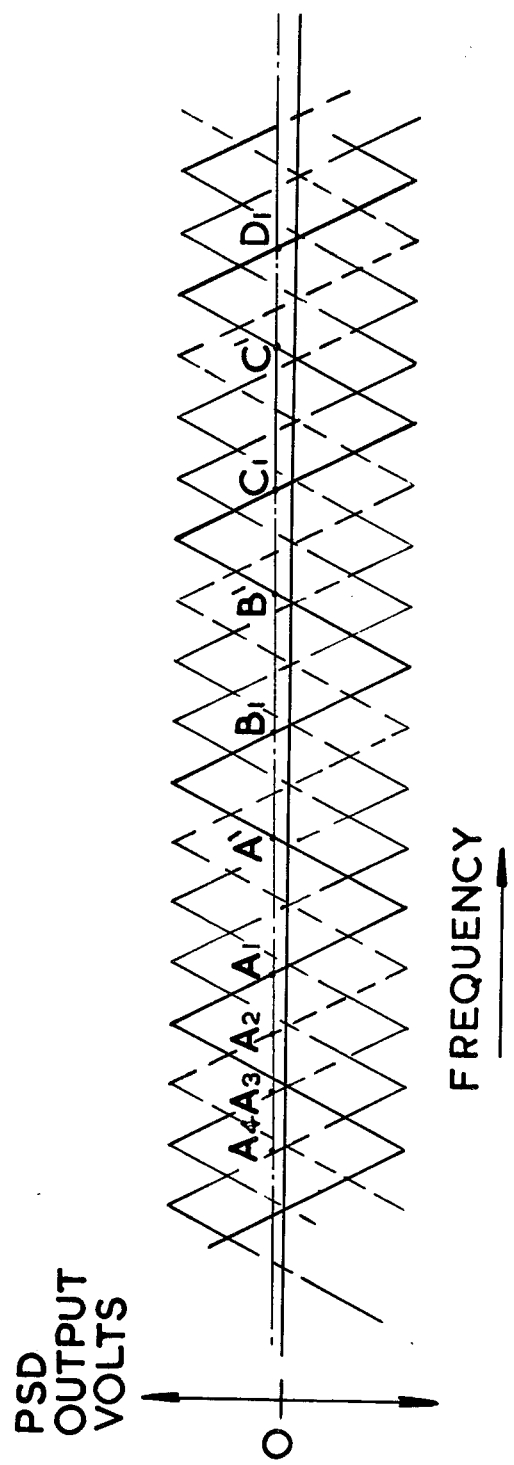

The invention will now be described by way of example only with reference to the accompanying drawings of which:

FIG. 1 is a block diagram
FIG. 2 shows one form of discriminator
FIG. 3 is a graph of VCO frequency against control voltage
FIG. 4 is a waveform diagram showing the output of the four output transducers of the discriminator of FIG. 2.
FIG. 5 shows another form of discriminator As shown in FIG. 1 a voltage controlled oscillator (VCO) 1 has its r.f. output 2 monitored by a discriminator 3 whose output after amplification in amplifier 5 forms a control signal 4 for controlling the frequency of operation of the VCO 1.

The VCO 1 may take many standard forms. It may be an LC circuit, e.g. capacitance, inductance, and varactor arranged in parallel. Alternatively it may be a surface acoustic wave (SAW) oscillator which has a short acoustic path between its input and output transducers. A typical SAW oscillator has a SAW delay line forming a feed back loop to an amplifier. The delay line comprising an ST-cut quartz substrate carrying interdigital comb transducers.

A common feature of a VCO is its frequency control voltage graph of which FIG. 3 is a typical graph. The frequency need not vary linearly with control voltage but should vary monotonically for use in the device of FIG. 1.

The discriminator 3 is shown in FIG. 2 to comprise an ST-cut quartz substrate 6 which carries an input transducer 7 for launching SAW along a track in the substrate 6. Disposed across this track 8 are four output transducers 9,10,11,12 spaced $\lambda_o/4$ apart along the track where $\lambda_o$ is the SAW wavelength at the transducer centre frequency. In a typical example the centre frequency was 60 MHz the input transducer was non dispersive and had 20 finger pairs, each output transducer had 20 finger pairs and the path length between input and output was about $600\lambda_o$. Each output transducer 9,10,11,12 is connected to a rotary switch 13 which has four equal resistors $R_1$, $R_2$, $R_3$, $R_4$, and a central rotatable wiper 15. Thus each output transducer in turn may be connected through a linear or limiting amplifier 15 to one input of a phase sensitive detector (PSD) 16. The input transducer 7 receives r.f. signals from the VCO, while the second input to the PSD is obtained from the VCO via a linear or limiting amplifier 17.

In operation the PSD measures the phase difference between signals launched by the input transducer 7 and received by an output transducer 9,10,11,12. This phase difference varies with frequency. For sinewave input signals to the PSD (from linear amplifier) the output of the PSD varies sinusoidally with frequency.

However a more useful output from the PSD is a triangular waveform since it improves linerarity of control of the VCO and is particularly useful if it is required to impose f.m. on the output wave. Such a triangular waveform may be achieved by the limiting amplifiers 15 and 17 which effectively changes the sine wave output of the VCO into a square waveform.

Output from the PSD for the different output transducers is shown in FIG. 4 where it is seen that zero values appear at a comb of frequencies marked A, B, C etc. Zero value also occurs at frequencies marked A', B', C' etc. but the waveform slope either side of the zero is opposite to that at points A, B,C etc. A broken line which may be termed an operating line lies just above the zero line and its purpose will be described later.

For stable oscillation of the circuit of FIG. 1 the following conditions apply.

If $V_i$ be in the input voltage to amplifier 5
$V_o$ be the output voltage from amplifier 5

G be the gain of amplifier 5
fx be a stable frequency of the VCO
then $$V_o = G\,V_i$$

$V_o$ into the VCO results in frequency $fx$ (from FIG. 3) frequency $fx$ into the discriminator 3 results in an output of $V_i$.

The gain of amplifiers is considerable, eg $10^4$, and therefore $V_i$ will be very small –almost zero. The voltage conditions for stable operation are shown in FIG. 4 where the PSD output crosses the operating line which is deliberately drawn in an exaggerated manner for ease of understanding. In practice the operating line is practically indistinguishable from the zero line. Thus the frequency A, B, C etc. are to be considered as the frequencies the waveform crosses the operating.

Assume now the discriminator is arranged with th upper output transducer 9 connected to the PSD. The VCO can thus operate at frequenices corresponding to $A_1\,B_1\,C_1$ etc. Assuming it is operating at $A_1$ then an increase or decrese in the VCO frequency will result in a decrease or increase in the control signal voltage 4 to apply a correction until the VCO again operates at $A_1$ frequency. If for some reason the VCO attempts to oscillate at a frequency corresponding to A, then the slope of the control signal is of the incorrect sign and therefore the circuit of FIG. 1 is unstable. In such a case the VCO will rapidly change its frequency to correspond to $A_1$ or $B_1$.

If now it is required to change the VCO frequency from $A_1$ to correspond to $A_2$ then the rotary switch is operated to connect the output transducer 10 to the PSD. The control signal 4 then applies a correcting voltage until the VCO is oscillating at a frequency corresponding to $A_2$.

In a similar manner the rotary switch 3 may be operated to change the VCO frequency to correspond to any of the modes indicated at $A_1, A_2 \ldots B_1 B_2 \ldots C_1, C_2 \ldots$ etc. Thus the configuration of the discriminator controls the frequencies at which the VCO can operate and therefore the frequencies are programmed by the discriminator design. Additionally further frequencies are obtained by combining the output of two output transducers.

To change the VCO frequency quickly by a large amount the control voltage may be temporarily disconnected and an appropriate voltage imposed on the VCO input. An actual disconnection of the control signal 4 is unnecessary, instead an appropriate voltage from a low impedance source can temporarily over-ride the control signal 4 for a sufficient time to allow the VCO to oscillate at the new mode.

With non-dispersive transducers frequency separation of modes between output transducers varies slightly away from the transducer centre frequency, i.e. the output tranducers are no longer ¼ wavelength apart. One solution to this problem is to modify the arrangements shown in FIGS. 2, and 5 by replacing the non-dispersive transducers shown and use dispersive transducers. With such transducers different frequencies are effectively launched from different parts of the transducer; this is achieved by varying the interfinger spacing along the transducer. Thus for a modified FIG. 2 the high and low frequency ends of the input transducer 7 may be the left and right ends respectively as seen in the drawing, whilst the high and low frequency ends of the output tranducers 9, 10, 11, 12 are also the left and right ends respectively. In these circumstances the dispersion characteristics of the input and output transducers tend to cancel each other out. It is arranged that the input transducer and one output transducer, say 9, have identical dispersion characteristics so that this delay line as a whole is non-dispersive and the mode spacing is $1/\tau_a$ at all frequencies (where $\tau_a$ is the delay time which in these circumstances is independent of frequency). However the dispersion characteristics of 10, 11 and 12 are successively mismatched from the input transducer in such a manner that for each delay line the intermode spacing is $f = 1/\tau_a$ at all frequencies. In the illustrated arrangement of FIG. 2 the mode spacings with output transducers 10, 11, 12 are $f = 1/\tau_b,\ 1/\tau_c,\ 1/\tau_d$ respectively.

An additional advantage of using dispersive transducers is in their relative ease of matching to a 50 Ω source for minimum insertion loss over large bandwidths. For this reason there may be occasions where five transducers of identical dispersion characteristics are used in the arrangement of FIG. 2.

One problem with VCO is the possibility of multimoded oscillation, i.e. operation at a plurality of frequencies rather than one frequency. In these circumstances, the output is a frequency modulated wave with modulation rate equal to the mode separation (or a multiple thereof). This problem may be overcome with a SAW delay discriminator is the amplifier 5 has reduced bandwidth with a cut off below where $fz$ is the inverse of the SAW delay time. For example, if the delay time is 10 μs $fz$ is 100 KHz and therefore a cut off around say 50 KHz would prevent the undesired higher frequency (100 KHz and above) oscillator of the control signal 4.

Various other configurations of discriminator are possible. For example, the delay line may have more than 4 output transducers thereby giving closer spacing of frequency modes. Alternatively only three output transducers may be used. The output transducers may be on one or both sides of the input transducer.

Such an arrangement is shown in FIG. 5 which also shows a more practical way of connecting the output transducers to the PSD than the rotary switch of FIG. 2. As in FIG. 2 the discriminator 3 comprises a substrate 6 carrying an input transducer 7 for launching SAW in a track 8. Three output transducers 18, 19, 20 are arranged across the track 8 and spaced λo/3 apart along it. Output from each output transducer is through PIN diodes 21, 22, 23 to the PSD.

These PIN diodes are biassed in turn, e.g. through 1 k ohm resistors 24, 25, 26, and a three way switch 27 from a suitable voltage source (not shown). Each output transducer 18, 19, 20 can therefore be connected in turn to the PSD so that the discriminator operates as described with reference to FIGS. 1, 2 but with slightly greater frequency changes between steps.

In another discriminator two output transducers are used spaced λo/4 apart along the SAW track. The two combs of each output transducer can be connected to earth or the PSD through biassed PIN or NIP diodes.

The PIN diodes may be replaced by other solid state voltage controlled impedances e.g. NIP diodes, varacter, or variable gain amplifiers.

I claim:

1. A discriminator for use in controlling the output frequency of a voltage controlled oscillator, comprising:

an acoustic wave delay line and a phase sensitive detector arranged to measure the phase difference between signals applied to the delay line and signals received from the delay line and produce a signal representing such phase difference, wherein the delay line comprises a substrate capable of supporting acoustic waves, first and second transducer means arranged on the substrate and connected to the phase sensitive detector to launch and receive acoustic waves in and from the track, the second transducer means arranged on the substrate and connected to the phase sensitive detector to launch and receive acoustic waves in and from the track, the second transducer means comprising a plurality of transducers each spaced apart along the track at a different distance from the first transducer means, and each being capable of supporting oscillation at a number of harmonic frequencies, said difference in distance being less than one wavelength at the transducer means center frequency, and switch circuitry for selectively switching each of the plurality of transducers to the phase sensitive detector so that by sequential operation of said switching means the oscillator may be caused to oscillate any one of said harmonic frequencies such number being much greater than the number of second transducers.

2. A discriminator according to claim 1 wherein the transducer means are dispersive transducers.

3. A discriminator according to claim 1 wherein the transducer means are non-dispersive transducers.

4. A discriminator according to claim 1 wherein the switch circuitry includes electrically controlled variable impedances.

5. A discriminator according to claim 1 and further comprising limiting amplifiers arranged between the transducers and phase sensitive detector whereby the phase sensitive detector output varies in a triangular waveform manner.

6. A discriminator according to claim 1 and further including a voltage controlled oscillator whose output frequency is controlled by the output of the phase sensitive detector.

7. A discriminator according to claim 6 wherein the voltage controlled oscillator is a surface acoustic wave oscillator comprising an amplifier and a surface acoustic wave delay line connected to form a feedback loop to the amplifier.

8. A discriminator according to claim 1 wherein the transducers are amplitude weighted.

9. A discriminator according to claim 1 wherein the plurality of transducers are all arranged on the same side of the first transducer means.

* * * * *